United States Patent
Kabune et al.

(10) Patent No.: US 7,830,286 B2
(45) Date of Patent: Nov. 9, 2010

(54) AD CONVERTER AND DATA PROCESSING UNIT

(75) Inventors: Hideki Kabune, Nagoya (JP);
Nobuhiko Makino, Anjo (JP);
Tomoharu Hayakawa, Kasugai (JP);
Hitoshi Ishikawa, Tokyo (JP); Tatsuya Aizawa, Tokyo (JP); Shigeo Uno, Tokyo (JP); Masamitsu Ozeki, Tokyo (JP)

(73) Assignee: Denso Corporation, Kariya (JP)

( * ) Notice: Subject to any disclaimer, the term of this patent is extended or adjusted under 35 U.S.C. 154(b) by 32 days.

(21) Appl. No.: 12/467,502

(22) Filed: May 18, 2009

(65) Prior Publication Data
US 2009/0289822 A1    Nov. 26, 2009

(30) Foreign Application Priority Data
May 23, 2008    (JP)    ............................ 2008-135313

(51) Int. Cl.
*H03M 1/00*    (2006.01)
(52) U.S. Cl. .................. 341/122; 341/141; 341/155
(58) Field of Classification Search ........... 341/122, 341/141
See application file for complete search history.

(56) References Cited

U.S. PATENT DOCUMENTS

| | | | | |
|---|---|---|---|---|
| 6,653,963 | B1 * | 11/2003 | Barrenscheen et al. | 341/155 |
| 7,009,537 | B2 * | 3/2006 | Kabune | 341/120 |
| 7,245,248 | B2 * | 7/2007 | Morita et al. | 341/155 |

FOREIGN PATENT DOCUMENTS
JP    5-314281    11/1993

* cited by examiner

*Primary Examiner*—Khai M Nguyen
(74) *Attorney, Agent, or Firm*—Nixon & Vanderhye PC (57) ABSTRACT

An AD converter includes an input circuit, an operation circuit and a bus interface. The input circuit is provided with a pull-down circuit, which is capable of pulling down an analog signal input side of a sample-hold circuit whether an analog signal is inputted or not. The operation circuit is provided with a reference voltage conversion result storing register, which is capable of storing a conversion result of an analog reference voltage inputted periodically separately from a conversion result of the analog signal inputted through the sample-hold circuit. The operation circuit is further provided with a check register, which is capable of writing in and reading out data for checking operation of a signal transfer system including a bus interface through the bus interface. Thus, it is made possible to confirm normality of an external part and an internal part of the AD converter.

5 Claims, 8 Drawing Sheets

AD CONVERTER AND DATA PROCESSING UNIT

CROSS REFERENCE TO RELATED APPLICATION

This application is based on and incorporates herein by reference Japanese Patent Application No. 2008-135313 filed on May 23, 2008.

FIELD OF THE INVENTION

The present invention relates to technology for enhancing reliability of analog/digital (AD) conversion. For example, the present invention relates to technology, which is effectively applied to a microcomputer having an AD conversion function.

BACKGROUND OF THE INVENTION

Some conventional single-chip microcomputers have built-in AD converters. Further, some microcomputers have a plurality of analog input terminals for receiving a plurality of analog signals. The microcomputer is increased in size, if a plurality of AD converters is built in corresponding to the number of the analog input terminals. For this reason, a microcomputer is configured to have only one built-in AD converter relative to a plurality of analog input terminals, and the AD conversion is performed by using the time-divided multiplexing by changing the analog input terminals by switches. In such a single-chip microcomputer having only one AD converter relative to a plurality of analog input terminals, an input terminal automatic multiplexing function is provided so that a plurality of input signals is sampled and AD-converted by sequentially selecting the plurality of analog input terminals. The AD conversion results are stored in registers, and read out by interrupting a central processing unit (CPU) when a series of conversion has been completed.

However, according to the conventional art, it is only possible to perform a fixed operation of sampling and AD-converting the input signals by sequentially selecting the plurality of analog input terminals. As a result, in designing application systems using the single-chip microcomputers (for example, control systems for cameras or copying machines), a microcomputer is forced to be used to reduce system costs even if the input terminal multiplexing function affixed to the AD converter does not match the system specification. If the system performance is to be prioritized, a change-over switch and a control circuit for the switch are provided as an external circuit, which realizes an exclusive multiplexing function, externally to the microcomputer to satisfy the system specification.

It is therefore proposed to enhance general-purpose operability by most effectively using the performance of the AD converter in the microcomputer with a built-in AD converter in relation to the system requirements (for example, JP 05-314281A). For example, in the microcomputer, which has only one built-in AD converter relative to the plurality of analog input terminals and performs AD conversion in time-divided multiplexing method by changing over the terminals, a control register, a selector circuit and a memory circuit are provided. The control register is for designating specified terminals among the analog terminals to be used. The selector circuit is for generating a control signal for selecting the switches in correspondence to the contents of the control register. The memory circuit is for storing data indicating the input terminal, which corresponds to the input terminal, which is under the present AD conversion. The sampling and AD conversion are performed on only the input signals applied to the terminals designated by the contents of the control register by shift-operating the memory circuit by a clock.

In some cases, it need be determined whether the AD conversion is performed properly in the AD converter, particularly the AD converter built in the microcomputer. This may be attained by checking whether the external part and the internal part of the AD converter are in the normal condition. It need be also determined whether the AD conversion result of each channel is accurate in a case that a plurality of AD conversion channels is provided. In particular, such checking is strongly required in microcomputers used in automotive control systems. The conventional technology does not satisfactorily meet the above requirements.

SUMMARY OF THE INVENTION

It is therefore an object of the present invention to make it possible to determine whether AD conversion is performed properly by checking whether an external part and an internal part of an AD converter are in a normal condition.

It is also another object of the present invention to make it possible to determine whether an accurate AD conversion result is produced from each channel in a case that a plurality of AD conversion channels is provided.

An AD converter according to the present invention includes an input circuit, an operation circuit and a bus interface. The input circuit includes a pull-down circuit, which pulls down an analog signal input side of a sample-hold circuit whether an analog signal is inputted or not. The operation circuit includes a reference voltage conversion result storing register and a checking register. The reference voltage conversion result storing register is capable of storing a conversion result of an analog reference voltage inputted periodically separately from a conversion result of an analog signal inputted through the sample-hold circuit. The checking register is capable of writing in and reading out data, which is for checking a signal transmission system including the bus interface, through the bus interface. Thus, it is made possible to check whether the external part and the internal part of the AD converter are in the normal condition.

According to the present invention, it is made possible to determine whether the AD conversion is performed properly by checking whether the external part and the internal part are in the normal condition. It is also made possible to determine whether an AD conversion result of each channel is accurate in a case that a plurality of AD conversion channels is provided.

DETAILED DESCRIPTION OF THE PREFERRED EMBODIMENT

According to a first embodiment (FIG. 1), an AD converter 15 includes an input circuit 40, an operation circuit 30 and a bus interface 307. The input circuit 40 is for taking in analog signals. The operation circuit 30 is capable of converting the analog signals taken in through the input circuit 40 into corresponding digital signals. The bus interface 307 is capable of outputting conversion results of the operation circuit 30 to an external bus. The input circuit 40 includes pull-down circuits (PD) 402, which pulls down the analog signal input sides of a sample-hold circuit 50 whether the analogs are inputted or not. In the operation circuit 30, a reference voltage conversion result storing register (ADRD) 303 is provided. This register 303 is capable of storing the conversion result of the analog reference voltage periodically inputted separately from the conversion result of the analog signals inputted through the sample-hold circuit 50. Further, a checking register 306 is provided in the operation circuit 30. This register 306 is capable of writing in and reading out through the bus interface 307 data for use in checking operation of a signal transmission system including the bus interface.

According to a second embodiment (FIG. 2), an AD converter 15 has an input circuit 40, an operation circuit 30 and a bus 308. The input circuit 40 is for taking in analog signals. The operation circuit 30 is capable of converting the analog signals taken in through the input circuit 40 into corresponding digital signals. The bus 308 is capable of outputting conversion results of the operation circuit 30 to an external section. The input circuit 40 includes a plurality of channels, which enable taking-in of inputted analog signals. The operation circuit 30 includes a conversion result storing register 33, a parity bit generator circuit 32 and a parity bit register 35. The conversion result storing register 33 is capable of storing a conversion result of the analog signal inputted through each of the channels of the input circuit 40. The parity bit generator circuit 32 is provided is provided in correspondence to the conversion result storing register and is for generating a parity bit for the conversion result of the analog signal inputted through the input circuit. The parity bit register 35 is capable of storing a parity bit generated by the parity bit generator circuit 32. Together with the conversion result of the input analog signal of each channel of the input circuit 40, corresponding channel identification information is written in the conversion result storing register 33.

If the register 303 includes a conversion result outputting register 38 (FIG. 3) to which the stored data of the conversion result storing register 33 is transferred, a controller 70 may be provided to clear the AD conversion result outputting register 33 each time the data of the AD conversion result outputting register 33 is read out from an external section through the bus.

Figure 1:
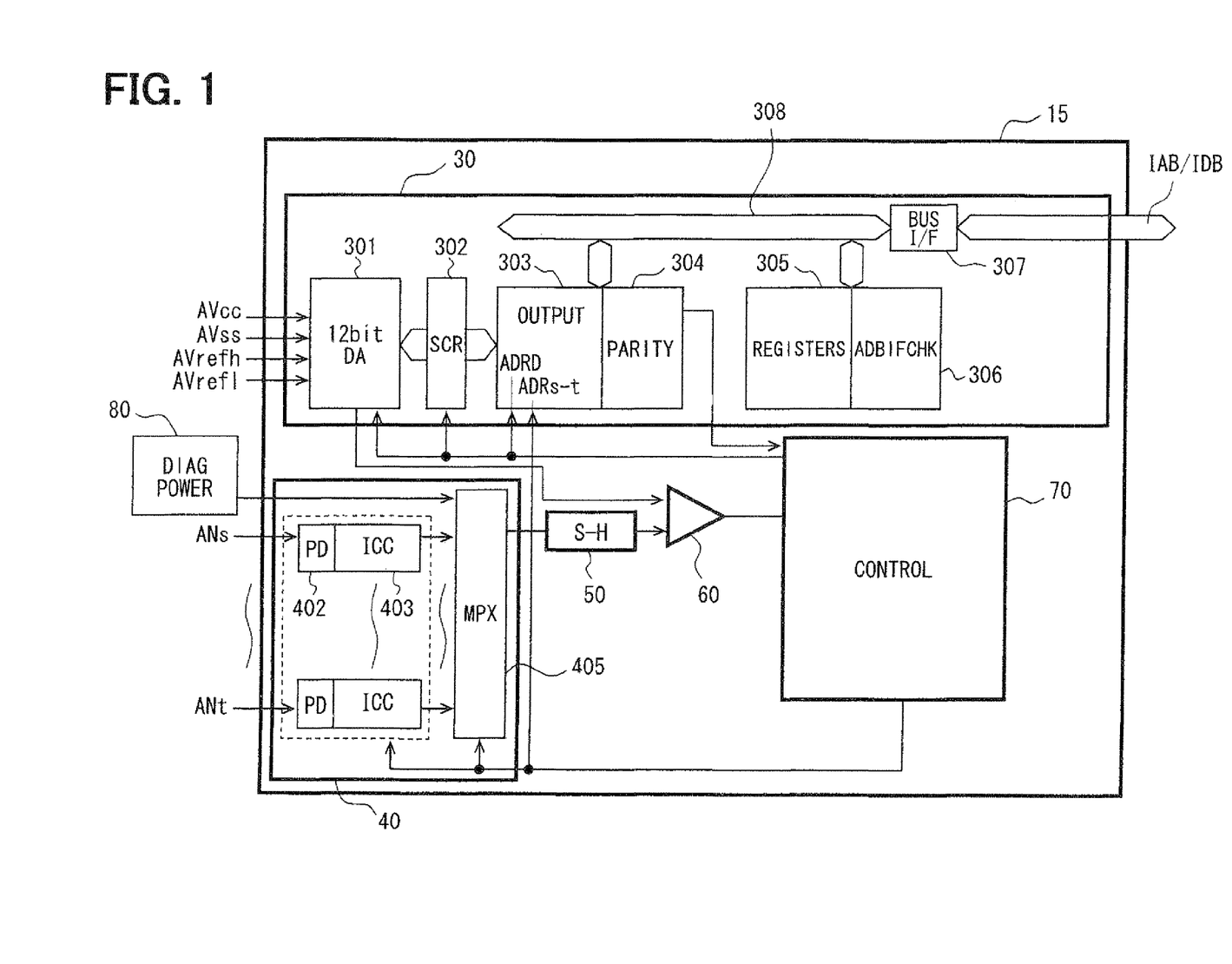
FIG. 1 is a block diagram of an AD converter according to a first embodiment.

In the embodiment of FIG. 1, the input circuit 40 includes a plurality of channels, which enables taking-in of inputted analog signals. The operation circuit 30 includes a conversion result storing register 33, a parity bit generator circuit 304 and a parity bit register 304. The conversion result storing register 33 is capable of storing a conversion result of the analog signal inputted through each of the channels of the input circuit 40. The parity bit generator circuit 32 is provided in correspondence to the conversion result storing register 33 and for generating a parity bit for the conversion result of the analog signal inputted through the input circuit 40. The parity bit register 304 is capable of storing a parity bit generated by the parity bit generator circuit. Together with the conversion result of the input analog signal of each channel of the input circuit 40, corresponding channel identification information is written in the conversion result storing register 303.

Figure 9:
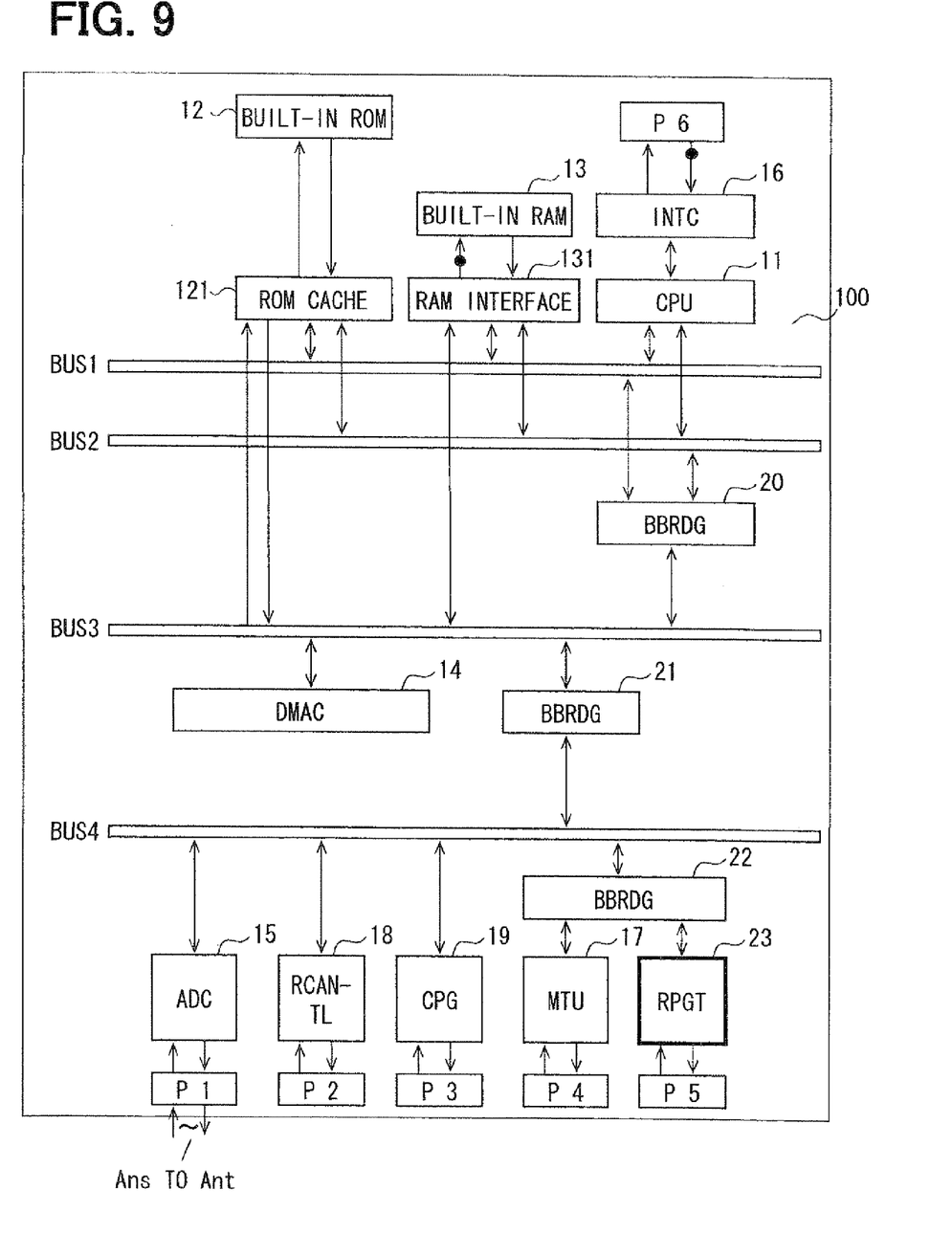
FIG. 9 is a block diagram of a microcomputer as a data processing unit including the AD converter.

A microcomputer (microprocessor, data processing unit) 100 shown in FIG. 9 is configured to include a CPU, which performs predetermined operation processing by taking in digital signals produced by the AD converter 15.

The microcomputer 100 is described first with reference to FIG. 9.

The microcomputer 100 is formed on one semiconductor substrate such as a mono-crystalline silicon substrate by conventional semiconductor integrated circuit manufacturing technology. The microcomputer 100 includes a built-in ROM (flash memory) 12, a built-in RAM (random access memory) 13, an interrupt controller (INTC) 16, a ROM cache 121, a RAM interface 131, a CPU (central processing unit) 11, bus bridges (BBRDG) 20, 21, 22, a direct memory access controller 14, the AD converter (ADC) 15, a controller area network (CAN) 18, a clock pulse generator (CPG) 19, and a timer (MTU) 17.

The built-in ROM 12 stores a program executed by the CPU 11. A flash memory is provided as the built-in ROM 12. The ROM cache memory 121 is connected to a CPU bus (fetch bus) BUS1, a CPU bus (memory access bus) BUS2 and an internal bus BUS3 thereby to reduce the number of access to the built-in ROM 12 by accumulating data, which will be used highly frequently. The CPU 11 performs the predetermined operation processing by executing the program stored in the built-in ROM 12. The built-in RAM 13 is connected to the CPU buses BUS1, BUS2 and the internal bus BUS 3, and used as working area of the operation processing of the CPU 11. The interrupt controller (INTC) 15 is provided to enable external interrupts to the CPU 11. This interrupt controller 16 controls interrupts to the CPU 11 based on an NMI (non-maskable interrupt) or an IRQ (interrupt request) inputted through a port P6. The CPU buses BUS 1, BUS2 are connected to the internal bus BUS3 through the bus bridge (BBRDG) 20. The internal bus BUS3 is connected to a peripheral bus BUS4 through the bus bridge (BBRDG) 21. The DMAC 14 is connected to the internal bus BUS3. The DMAC 14 enables data transfer without the CPU 11 between the memories or between the memories and the circuit modules (AD converter (ADC) 15, controller area network (CAN) 18, clock pulse generator (CPG) 19, timer 17). The ADC 15, CAN 18, CPG 19 and timer 17 are connected to the peripheral bus BUS 4. The ADC 15 converts the analog signals inputted through a port P1 into the digital signals. The CAN 18 enables exchange of a variety of information in the control area network through a port P2. The CPG 19 is connected to a crystal oscillator through crystal oscillator connecting terminals XIN, XOUT provided as external terminals through a port P3 thereby to generate a clock signal of a predetermined frequency.

The microcomputer 100 operates in synchronized relation with the clock signal generated by the CPG 19. The timer 17 enables inputting and outputting of a variety of timer pulses through a port P4. A RPGT 23 is configured as a PWM timer, which can vary a duty periodically. The RPGT 23 can vary periodically in time sequence a duty of a waveform of a PWM pulse outputted externally through the port P6 by setting an arbitrary duty value pattern in a duty value RAM, which will be described later. The timer 17 and the RPGT 23 are connected to the peripheral bus BUS4 through the bus bridge (BBRDG) 21. The timer 17 and the RPGT 23 are operated at, for example, 80 MHz to improve resolving power, while the clock frequency in the peripheral bus BUS4 is, for example, 40 MHz. Therefore, frequency conversion is performed in the bus bridge 19 to match the bus cycle.

The CPU 11 has sixteen 32-bit general registers and operates based on the clock signal from the clock pulse generator CPG 19. The CPU 11 performs specifically execution of instructions fetched from the memories, the predetermined operation processing and control of operation of each part.

The built-in ROM 12 is provided as a program memory for storing the program, which is executed by the CPU 11. The built-in ROM 12 is connected to the CPU 11 through the ROM cache 121 and the internal buses BUS1, BUS2 thereby to be made accessible by the CPU 11. The ROM 12 is capable of electrically rewriting storage information, while being mounted on a system board or by execution of a predetermined rewriting program.

The built-in RAM 13 is connected to the CPU 11 through the RAM interface 131 and internal buses BUS1, BUS2 thereby to be randomly accessible by the CPU 11. The built-in RAM 13 is loaded with the program, which is executed by the CPU 11. The built-in RAM 13 is used as a working area of the operation processing performed by the CPU 11.

The AD converter 15 according to the first embodiment is shown in FIG. 1.

The AD converter 15 includes the input circuit 40 for taking in the analog signals, the sample-hold (S-H) circuit 50 for sampling and holding an output signal of the input circuit 40, a comparator 60 for comparing input signals, the control circuit 70 for controlling operation of each part, and the operation circuit 30 for performing a variety of processing related to the AD conversion of the analog signals. The control circuit 70 is connected to the CPU 11 and the like through a control bus (not shown) to exchange various control signals.

The input circuit 40 includes a plurality of impedance conversion circuits (ICC) 403 provided in correspondence to analog input terminals ANs to ANt, an analog multiplexer 405 provided at the following stage for selecting output signals of the plurality of impedance conversion circuits 403, and the pull-down circuits (PD) 402 provided at the preceding stage of the plurality of impedance conversion circuits 403. Each pull-down circuit 402 pulls down the analog signal input side of the corresponding impedance conversion circuit 403 whether the analog signal is inputted or not.

The operation circuit 30 includes a 12-bit DA (digital/analog) conversion part 301, a sequential conversion register 302 for sequentially converting analog outputs of the DA conversion part 301 into digital signals, a conversion result output circuit 303 for outputting the AD conversion result to an AD conversion internal bus 308, a parity circuit 304 for enabling parity check on the AD conversion result, a check register (ADBIFCHK) 306 capable of writing in and reading out data for checking operation of the bus interface 307 through the bus interface 307, and the like. To the 12-bit DA conversion part 301, a high potential-side electric power source AVcc, a low potential-side electric power source AVss and reference voltages AVrefh, AVrefl, all which are of the analog system, are inputted for AD conversion from the external part of the microcomputer 100 through external terminals.

With this configuration, AD conversion can be performed according to setting of an AD setting register 306 such as ADCSR and the like. The input circuit 40 takes in the analog signals through the analog terminals (Ans to Ant). The number of analog terminals are plural and only one input signal is selected automatically by the analog multiplexer 405 built in the input circuit 40. The selected analog signal is inputted to the S-H circuit 50. A value of only one certain analog signal among ANs to ANt is selected by the analog multiplexer 405 at some time point and held by the S-H circuit 50. By using this value held by the S-H circuit 50, the inputted analog signal and a specific analog value inputted from the 12-bit DA converter 301 are compared repeatedly. The storage information of the sequential conversion register (SCR) 302 is updated by the comparison result. The conversion result is stored in the register corresponding to the input channel at the end of repeated comparison, thereby performing the AD conversion. The AD conversion result is stored in a predetermined register in the conversion result output circuit. The AD conversion result is read out by a bus master such as the CPU 11 or the DMAC 14, and transferred to a target circuit block, for example, the internal RAM 13. If any data is collapsed (broken) for some reason in a series of inputting analog signals, converting data, processing and transferring, the system using the AD converter 15 will operate erroneously. Therefore, the present embodiment is provided with the following functions to enhance the reliability of the AD conversion result.

(A) Parity Function

A parity bit is generated and stored in the parity register when the AD conversion result is written in a predetermined register of the conversion result output circuit 303. This is for avoiding collapse (break) of AD-conversion data before being read out by the CPU 11 or the like. The parity check is performed when the AD conversion result is read out by the CPU 11 or the like.

Figure 3:
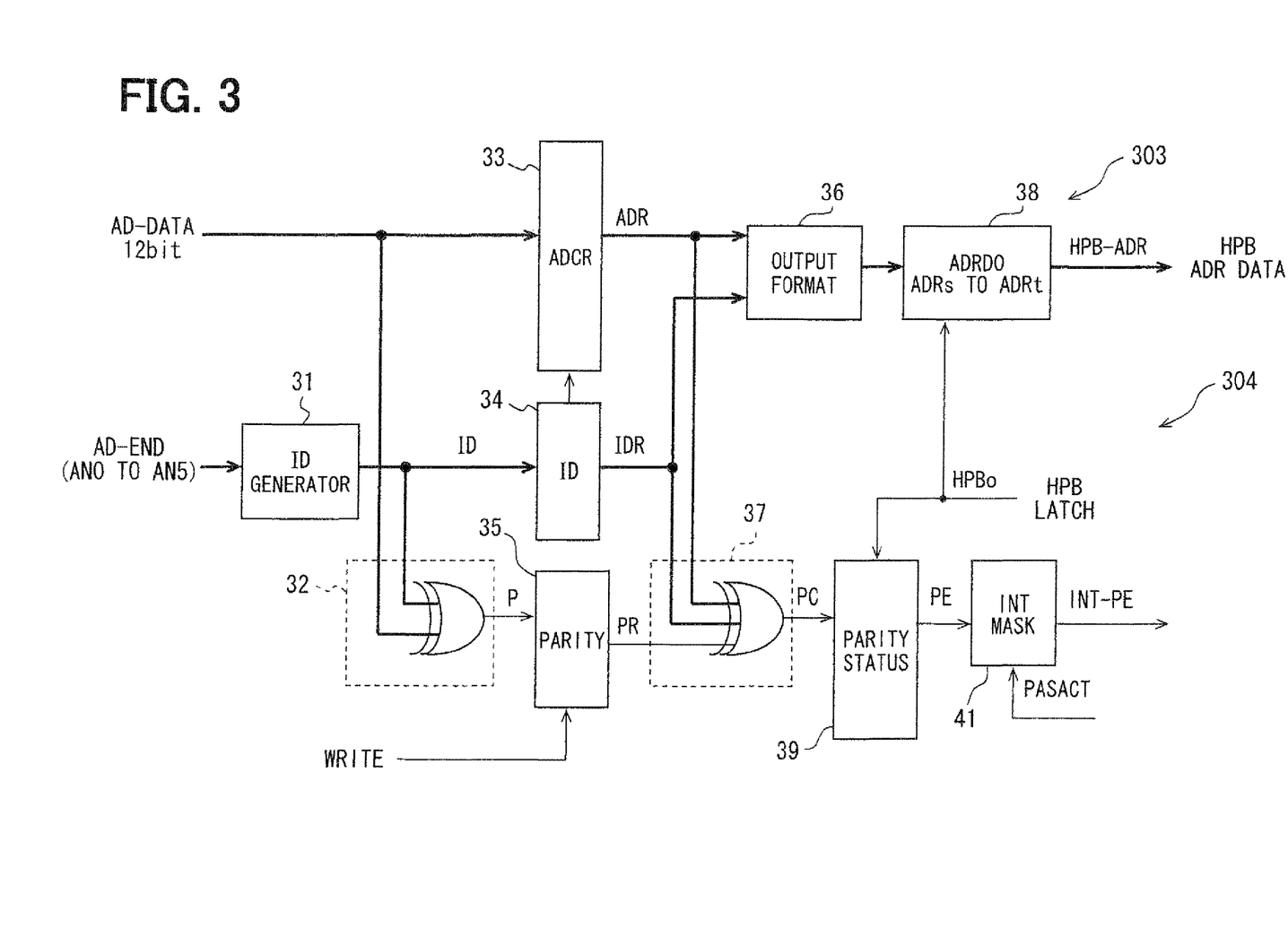
FIG. 3 is a block diagram of an exemplary configuration of a main part of the AD converter.

The conversion result output circuit 303 and the parity circuit 304 are shown in detail in FIG. 3. The conversion result output circuit 303 includes an ID generator module 31, an AD conversion result register (conversion result storing register) 33, an ID register 34, an output format shaping logic circuit 36 and an ADR register (conversion result outputting register) 38. The AD conversion result register 33 includes a plurality of registers (memory part) corresponding to the input channels, and stores the AD conversion data AD-DATA of 12-bit format produced consecutively from the conversion register 302.

The ID generator module 31 generates a channel identifier ID based on an AD-END pulse indicating the end of AD conversion of each input channel. The output data ID of the ID generator module 31 is stored in the following stage ID register 34. The output format shaping logic circuit 36 shapes the output format of the output data ADR of the AD conversion result register 33 and a channel identifier ID outputted from the ID register 34. The output format shaping result is written into the following stage ADR register 38 in synchronism with a HPB latch pulse HPBo. The ADR register 38 includes a plurality of registers (memory part) corresponding to the analog input channels ANs to ANt and is configured to store the AD conversion result of each channel in the corresponding one of registers ADRs to ADRt. The data written into the ADR register 38 is outputted to the internal bus IDB through the AD conversion internal bus 308 and the bus interface 307.

The parity circuit 304 includes a parity generator circuit 32, a parity register (parity bit register) 35, a parity operation circuit 37, a parity status register 39 and an interrupt mask logic circuit 41. The parity generator circuit 32 generates the parity bit based on the 12-bit AD conversion data AD-DATA outputted from the consecutive conversion register 302 and the output data ID of the ID generator module 31. The parity bit P is stored in the following stage parity register 35 in synchronism with a write pulse. The parity operation circuit 37 performs the parity operation based on the output data ADR of the AD conversion result register 33, the output data IDR of the ID register 34 and the output data PR of the parity register 35, when the data is read out from the ADR register 38. By this parity operation, it is made possible to check whether the data read out from the ADR register 38 is proper as an AD conversion result. The operation result PC of the parity operation circuit 37 is written into the following stage parity status register 39.

Figure 4:
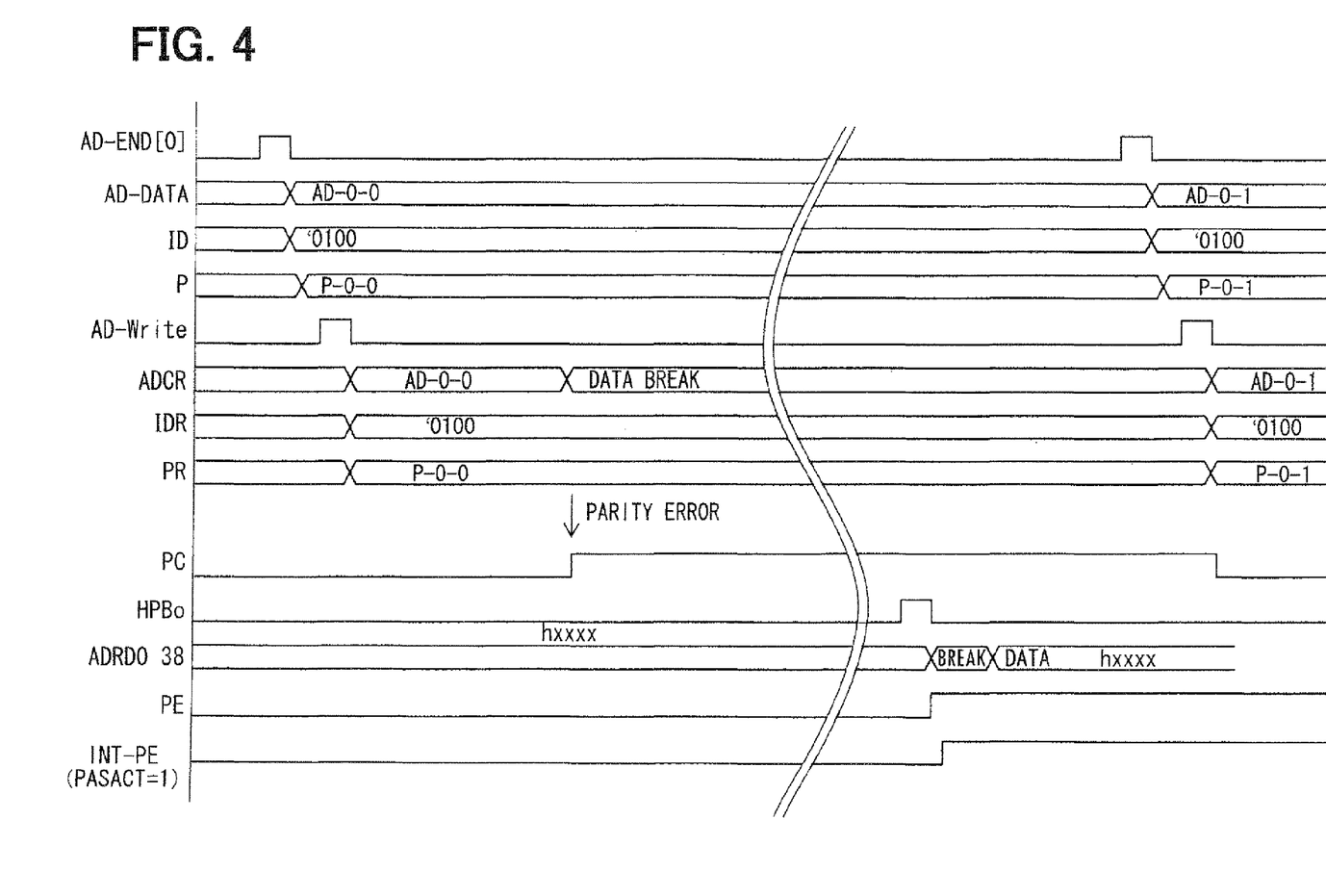
FIG. 4 is an operation timing diagram of the main part of the AD converter.

Operation timing of the main part of the parity circuit 304 is shown in FIG. 4.

When any corruption of data or the like arises, an output data PC of the parity operation circuit 37 becomes high in signal level indicating a parity check error. For example, under a condition that the parity error interrupt is not masked because a parity error interrupt mask signal PASACT=1 is made high, a parity error interrupt request signal INT-PE is asserted to high by the interrupt mask logic circuit 41. Thus, the CPU 11 performs predetermined error processing, and it is thereby avoided that unwanted AD conversion result will be used in processing.

(B) Real-Time Saving Function of Channel Identification Number

Figure 5:
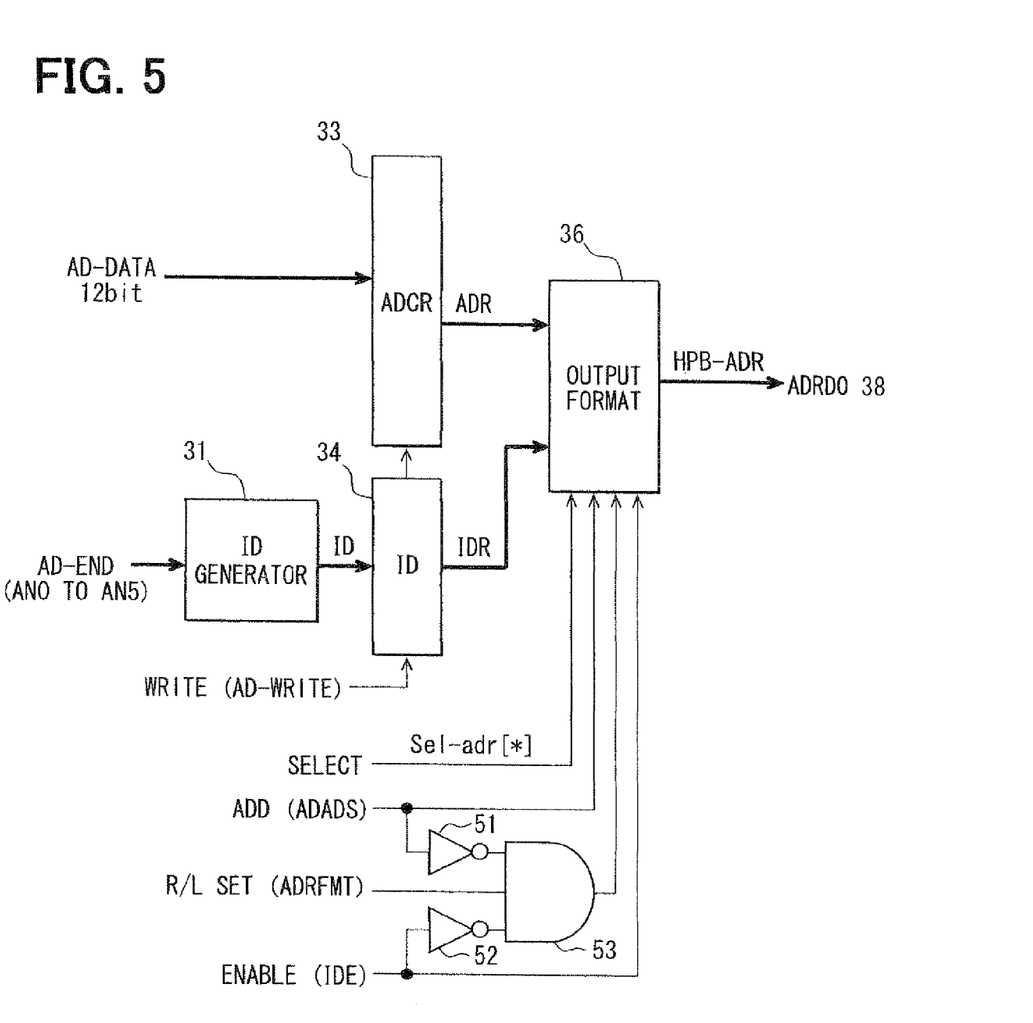
FIG. 5 is a block diagram of an exemplary configuration of a main part of the AD converter.

The real-time saving function of channel identification number is a function of saving the number of channel (channel identification number) in the ADR register 38 in real time, so that, by selecting one input signal from the plurality of analog input terminals ANs to ANt, it may be checked later by software or the like whether the selected signal is saved in the data register of the corresponding channel. This function is realized by the ID generator module 31, the ID register 34 and the output format shaping logic circuit 36 shown in FIG. 3. Specifically, by asserting the AD-END pulse indicating the end of AD conversion of each channel, the channel identifier ID is generated by the ID generator module 31 and this channel identifier ID is stored in the ID register 34. The output format shaping logic circuit 36 shapes the output format of the output data ADR of the AD conversion result register 33 and the channel identifier ID outputted from the ID register 34. The shaping of the output format by the output format shaping logic circuit 36 is controlled by the control circuit 70. As shown in FIG. 5, two inverters and a three-input AND gate. An output format selection signal Sel-adr[*] for register selection is inputted from the control circuit 70 to the output format shaping logic circuit 36. A conversion value addition mode signal ADADS and an identifier enable signal IDE are inputted to the output format shaping logic circuit 36 and also inputted to an AND gate 53 through inverters 51 and 52, respectively. In the AND gate 53, the output signals of the inverters 51, 52 and right/left tamping setting signal ADRFMT are subjected to the AND logic operation. This result is transferred to the output format shaping logic circuit 36.

Figure 6:
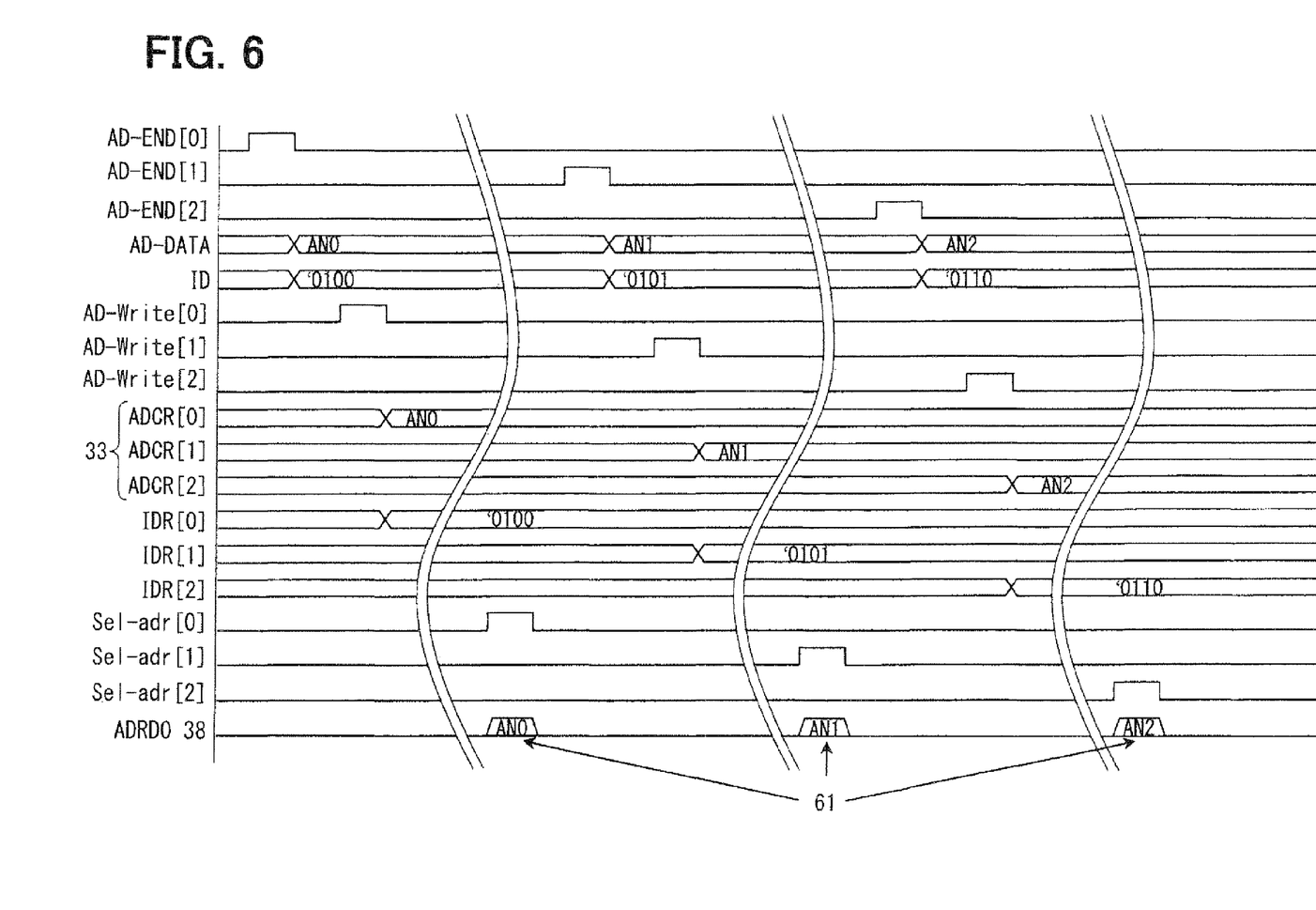
FIG. 6 is an operation timing diagram of the main part of the AD converter.

The operation timing of the main part in the identifier generation is shown in FIG. 6.

When the AD-END pulse AD-END[0], AD-END[1], AD-END[2] are asserted, the channel identifiers "0100," "0101," "0110" are generated. This channel identifier ID is stored in the ID register 34 in synchronism with a write pulse AD-Write[0], AD-Write[1], AD-Write[2]. When IDR[0], IDR[1], IDR[2] are selected from the ID register 34 by the output format selection signal Sel-adr[0], Sel-adr[1], Sel-adr[2], corresponding identifiers are attached to the corresponding AD conversion data AN0, AN1, AN2 as shown by 61 in FIG. 6. It may be designated by the right/left tamping setting signal ADRFMT whether the identifier is added to the rightmost position or the leftmost position relative to the AD conversion data AN0, AN1, AN2.

As a result of the output format shaping, the corresponding channel identifier ID is attached to the output data ADR of the AD conversion result register 33. According to the output data of the ADR register 38 into which the output format shaping result is written, the channel identifier ID is attached to the corresponding data. For this reason, it can be checked by the CPU 11 or the like based on the channel identifier ID whether the signal selected by the analog multiplexer 405 is saved in the corresponding register ADRs to ADRt without fail. For example, if the channel identifier ID attached to the data read out from the ADRs of the ADR register 38 corresponds to the analog input terminal ANs, it means that the AD conversion result of the desired channel is provided. However, if the channel identifier ID attached to the data read out from the ADRs of the ADR register 38 corresponds to the analog input terminal other than ANs, it means that the AD conversion result of the desired channel is not provided. In this case, it can be avoided that the undesired AD conversion result is used in the processing of the CPU 11.

(C) AD Conversion Function Confirming Function

In addition to the registers ADRs to ADRt corresponding to each channel, the ADR register 38 includes the reference voltage conversion result storing register ADRD, which is capable of storing the conversion result of the analog reference voltage generated by a self-diagnosis electric power generator 80 separately from the conversion result of the analog signal inputted through the sample-hold circuit 403. The analog voltage generated by the self-diagnosis electric power generator 80 is V, 2.5V and 5V. Under control of the control circuit 70, each reference voltage is periodically selected by the multiplexer 402 and AD-converted. This AD conversion result is written into the reference voltage conversion result storing register ADRD. Thus, for example, the CPU 11 can check whether the analog reference voltage has been AD-converted properly by periodically reading out the information stored in the reference voltage conversion result storing register ADRD. By this checking operation, abnormal conversion or failure of the AD converter 15 can be detected.

(D) Register Clearing Function

The plurality of registers ADRs to ADRt of the ADR register 38 are configured such that its storage data is cleared to "0" for example by the control circuit 70 when the CPU 11 or the DMAC 14 reads out data. Assuming that the voltage at the analog input terminals ANs to ANt never becomes 0V, even when the registers ADRs to ADRt of the ADR register 38 are cleared, the subsequent AD conversion operation is performed normally and the registers ADRs to ADRt of the ADR register 38 are updated. Therefore, when "0" continues in the registers ADRs to ADRt of the ADR register 38, it means that the AD conversion operation is not performed properly. Thus, by checking the storage information of the registers ADRs to ADRt of the ADR register 38 by the CPU 11, it can be checked whether the AD conversion operation is performed normally.

(E) Lead Solder Peel-Off Detecting Function

The lead solder peel-off detecting function is for detecting condition of peeling off of electric leads in the microcomputer 100, particularly leads corresponding to the analog input terminals ANs to ANt, from a user substrate. This function is realized by the pull-down circuit 402 provided in the input circuit 40. This input circuit 40 is configured as shown in FIG. 7.

Figure 7:
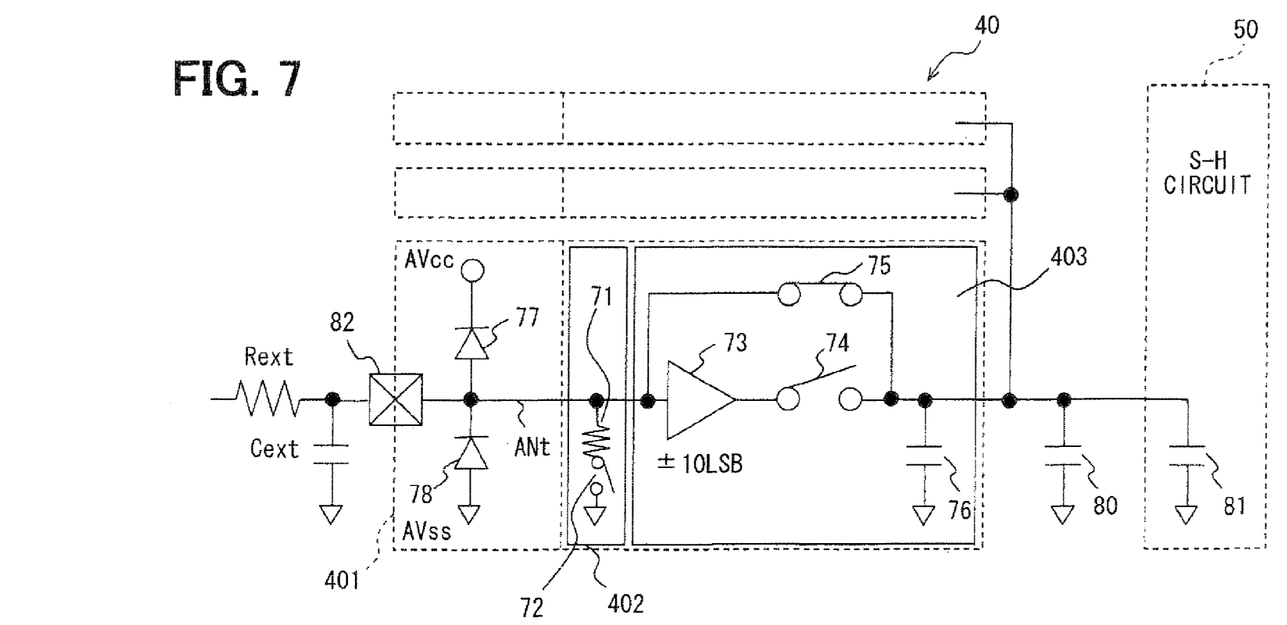
FIG. 7 is a circuit diagram of a main part of the AD converter.

Its circuit configuration is described with respect to one analog input terminal ANt with reference to FIG. 7.

The analog input terminal ANt is connected to an electric lead 82. This lead 82 is soldered to the user substrate. The analog signal is transferred to the lead 82 through an external resistor Rext and an external capacitor Cext in the user system and is further transferred to the pull-down circuit 402 through a protection circuit 401. The protection circuit 401 includes diodes 77 and 78. A current caused by an undesired positive voltage flows to a high potential-side electric power source AVcc of the analog system through the diode 77, and a current caused by an undesired negative voltage flows to a low potential-side electric power source AVss through the diode 78.

The impedance conversion circuit 403 includes an operational amplifier 73 and switches 74, 75. Each switch 74, 75 is formed by a MOS transistor. One end of the switch 75 is connected to an output terminal of the operational amplifier 73 so that an output signal of the operational amplifier 73 is transferred to the following stage circuit through the switch 74. The switch 75 is provided between the other end of the switch 74 and an input terminal of the operational amplifier 73. A capacitor 80 is provided between an output terminal of the impedance conversion circuit 403 and the low potential-side electric power source AVss. The capacitor 80 is for storing electric charge due to an inputted analog voltage and shared by the plurality of impedance conversion circuits 403. The circuit 403 has a parasitic capacitor 76, which operates in the same manner as the capacitor 80. The electric charge stored in a capacitor 81 provided in the S-H circuit 50 is AD-converted. The pull-down circuit 402 is provided between the input terminal of the operational amplifier 73 and the low potential-side electric power source AVss. The pull-down circuit 402 includes a resistor 71 and a switch 72 connected in series thereto. The switch 72 is formed by a MOS transistor.

Figure 8:
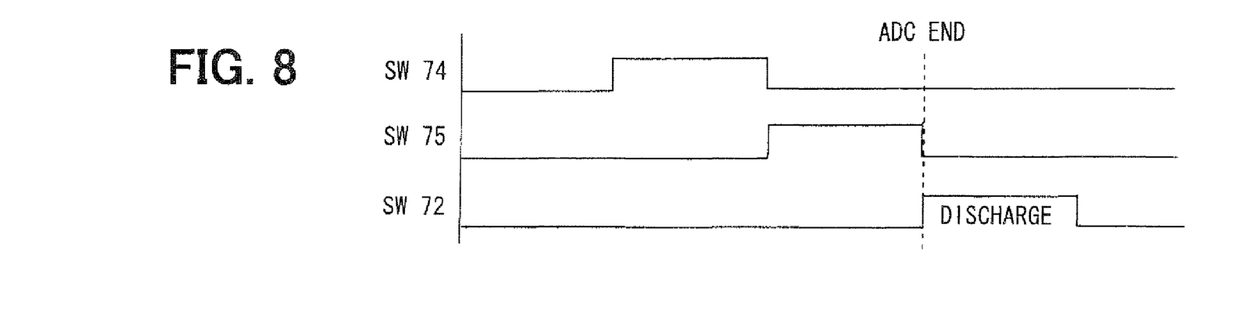
FIG. 8 is an operation timing diagram of the main part of the AD converter.

The operation timing of the main part of FIG. 7 is shown in FIG. 8.

First, by turning on the switch 74, the analog signal is sampled through the operational amplifier 73. By turning off the switch 74 and turning on the switch 75, the off-set (about 10 mV) of the operational amplifier 73 is removed. By turning off the switch 75, the analog signal is held. Then the AD conversion is performed. By turning on the switch 72 after the AD conversion has started, the resistor 71 pulls down the analog signal input-side such as a terminal capacitor and the like near the lead 82. By this pull-down, the accumulated electric charge at the analog signal input-side near the lead 82 is discharged to the low potential-side electric power source AVss of the analog system. If the lead 82 peels off from the user substrate, no analog signal is transferred from the user system through the external resistor Rext and the lead 82. That is, sufficient electric charge cannot be transferred from the user system. As a result, since the electric charge is discharged by the pull-down circuit 402 each time the AD conversion is performed at such an analog channel, the electric potential at the input terminal of the operational amplifier 73 soon becomes equal to the level of the low potential-side electric power source AVss of the analog system. If AD conversion is performed with respect to such a channel under this condition, "0" or a value close thereto is written into the ADR register 38. Therefore, by predetermining such a storage condition of a register to be an error, the error caused by the solder peel-off of the lead 82 can be determined by the CPU 11.

(F) Bus Function Normal Operation Confirming Function

A bus function normal operation confirming function is for confirming that the signal transfer system including the bus interface 307 has no failure. This function is realized by the check register 306 connected to the AD converter internal bus 308. The check register 306 is capable of writing in and reading out data, which is for checking the bus interface 307 and the bus 308, through the bus interface 307. This writing in and reading out of data is performed by the CPU 11. An arbitrary value is written into the check register 306 by the CPU 11 at the time of chip resetting. The data of the check register 306 is thereafter read out periodically. In this reading out, if the arbitrary value stored in the check register 306 is retrieved, the AD converter internal bus 308 and the bus interface 307 have no failure. However, if the arbitrary value stored in the check register 306 is not retrieved, the signal transfer system including the bus interface 307 has a failure.

According to the above embodiment, the following advantages are provided.

(1) If any data collapse or the like arises, the output data PC of the parity operation circuit 37 becomes high in signal level. This results in a parity check error, and the parity error interrupt mask signal PASACT=1 is made high. Under the condition that the parity error interrupt is not masked, a parity error interrupt request signal INT-PE is asserted to be high in signal level by the interrupt mask logic 41. As a result, the CPU 11 performs the predetermined error processing so that the undesired AD conversion result is not used in the processing.

(2). The corresponding channel identifier ID is attached to the output data ADR of the AD conversion result register 33. According to such an output data of the ADR register 38 into which the output format shaping result is written, since the channel identifier ID is attached, the CPU 11 or the like can check based on the channel identifier ID whether the signal selected by the analog multiplexer 405 is surely stored in the corresponding register ADRs to ADRt.

(3) The analog reference voltage generated by the self-diagnosis electric power generator 80 is set to, although not limited, 0V, 2.5V, 5V. The voltage is selected periodically by the multiplexer 402 under the control of the control circuit 70. The selected voltage is AD-converted and this AD conversion result is written into the reference voltage conversion result storing register ADRD. Therefore, the CPU 11 can periodically read out the information stored in the reference voltage conversion result storing register ADRD and check whether the analog reference voltage has been properly AD-converted. Owing to this checking, the reliability of the AD converter 15 can be enhanced.

(4) The registers ADRs to ADRt in the ADR register 38 is so configured that the storage data is cleared to "0" for example by the control circuit 70 when the CPU 11 or the DMAC 14 reads out data. Assuming that the voltage at the analog input terminals ANs to ANt never becomes 0V, even when the registers ADRs to ADRt of the ADR register 38 are cleared, the subsequent AD conversion operation is performed normally and the registers ADRs to ADRt of the ADR register 38 are updated. Therefore, when "0" continues in the registers ADRs to ADRt of the ADR register 38, it means that the AD conversion operation is not performed properly. Thus, by checking the storage information of the registers ADRs to ADRt of the ADR register 38 by the CPU 11, it can be checked whether the AD conversion operation is performed normally.

(5) The analog signal is sampled through the operational amplifier 73 by turning on the switch 74. The offset (about 10 mV) of the operational amplifier 73 is removed by turning off the switch 74 and turning on the switch 75. The analog signal is held by turning off the switch 75. Then the AD conversion is performed. By turning on the switch 72 after the start of AD conversion, the analog signal input side such as the terminal capacitor or the like near the lead 82 is pulled down by the resistor 71. By this pull-down, the accumulated charge at the analog signal input side near the lead 82 is discharged to the low potential-side electric power source AVss of the analog system. If the lead 82 peels off from the user substrate, the analog signal is not transferred from the user system through the external resistor Rext or the lead 82. Therefore, each time the AD conversion is performed at the analog channel, the electric charge is discharged by the pull-down circuit 402. As a result, the electric potential at the input terminal of the operational amplifier 73 soon becomes equal to the low potential-side electric power source AVss of the analog system. If the AD conversion of the channel is performed under this condition, "0" or the value close to "0" is written into the ADR register 38. By predetermining that such storage condition of the register is an error, the CPU 11 can determine that the error is caused by the solder separation of the lead 82.

(6) A unique value is written into the check register 306 by the CPU 11 at the time of chip resetting. Then the data in the check register 306 is read out periodically. In this reading out, the unique value stored in the check register 306 is read out, the AD converter internal bus 308 and the bus interface 307 has no failure. If the unique value stored in the check register 306 is not read out, it is assumed that the signal transfer system including the bus interface 307 has a failure.

(7) According to the above operation and advantages (3), (5) and (6), it can be readily confirmed that both the internal part and the external part of the AD converter 15 as well as the bus in the AD converter 15 are normal. As a result, correct AD conversion result can be provided.

(8) According to the above operation and advantages (1) and (2), the channel can be recognized and the parity check of the AD conversion result can be performed. Therefore, the AD conversion result of each channel can be provided accurately.

Figure 2:
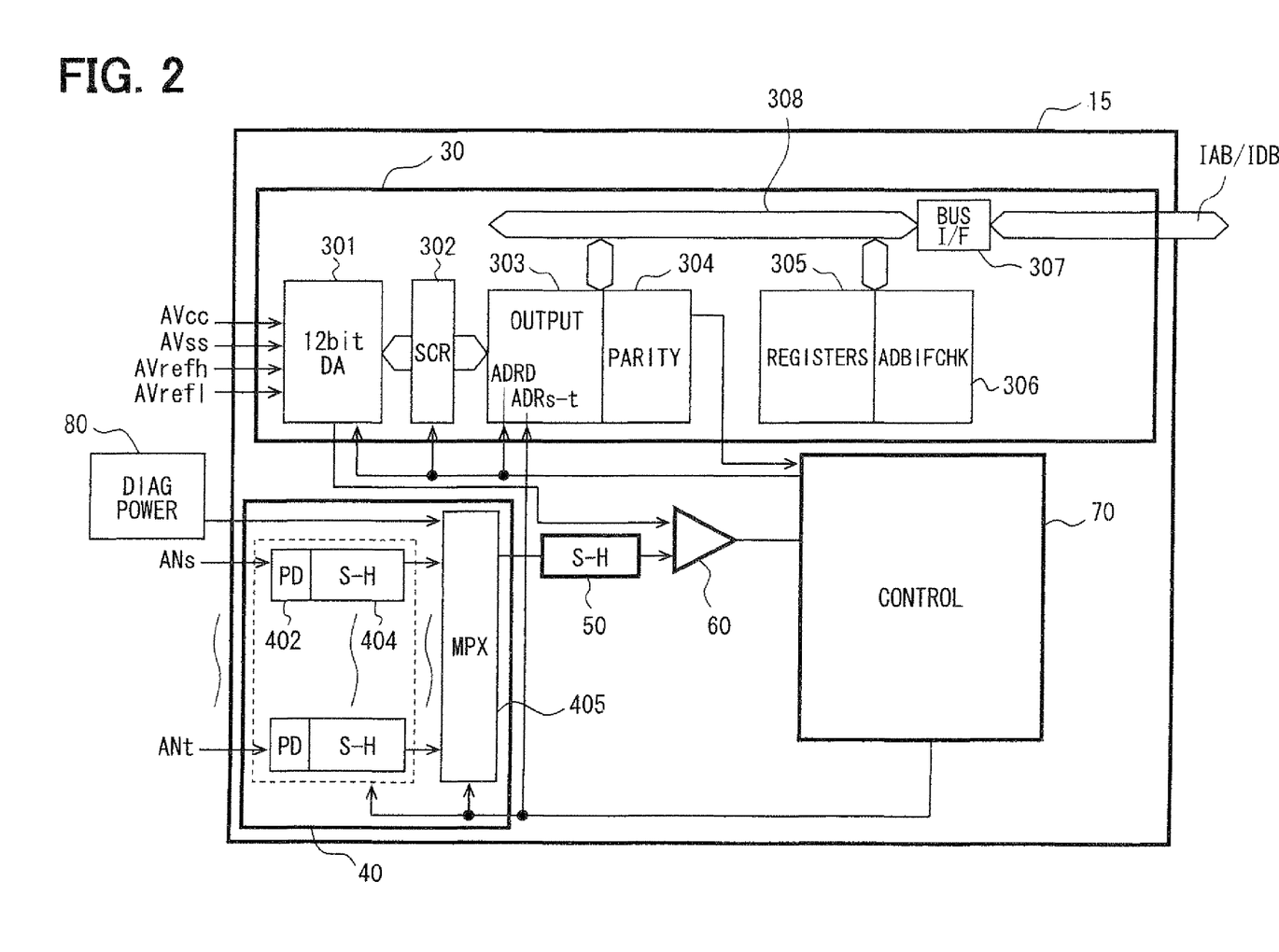
FIG. 2 is a block diagram of an AD converter according to a second embodiment.

The AD converter 15 according to the first embodiment may be configured as shown in a second embodiment shown in FIG. 2.

It is different from the first embodiment in that a S-H circuit 404 is provided in place of the impedance conversion circuit 403. According to this configuration, since the S-H circuit 404 is provided for each analog terminal (ANs to ANt), it becomes possible to sample analog signals at the same timing. The second embodiment is not different, however, in that the analog signals of a plurality of channels can be converted into the digital signals sequentially in the time-divided method. The second embodiment includes the similar circuits as in FIG. 1 and realizes the similar functions, with respect to other circuits. The second embodiment-also has the above-described functions provided to enhance reliability.

The present invention described as being applied to a microcomputer may be applied widely to a variety of data processing units.

What is claimed is:

1. An AD converter comprising:
an input circuit for taking in an analog signal;
a sample-hold circuit for holding the analog signal;
an operation circuit for converting the analog signal taken in through the input circuit into a digital signal; and
a bus interface for outputting a conversion result of the operation circuit to an external bus,
wherein the input circuit includes a pull-down circuit for pulling down an analog signal input-side of the sample-hold circuit whether the analog signal is inputted, and
wherein the operation circuit includes a reference voltage conversion result storing register and a check register, the reference voltage conversion result storing register storing a conversion result of an analog reference voltage inputted periodically separately from a conversion result of the analog signal inputted through the pull-down circuit, and the check register writing in and reading out data, which is for checking operation of a signal transfer system including the bus interface, through the bus interface.

2. The AD converter according to claim 1, further comprising:
a conversion result output register to which storage data of the conversion result storing register is transferred; and
a controller for clearing the AD conversion result output register each time the data of the AD conversion result output register is read out through the bus from an external part.

3. The AD converter according to claim 1, wherein:
the input circuit includes a plurality of channels, each of which takes in the analog signal;
the operation circuit includes a conversion result storing register, a parity bit generator circuit and a parity bit register, the conversion result storing register storing the conversion result of an input analog signal of each channel of the input circuit, the parity bit generator circuit being provided in correspondence to the conversion result storing register and generating a parity bit of the conversion result of the analog signal inputted through the input circuit, and the parity bit register storing the parity bit generated by the parity bit generator circuit; and
the conversion result storing register writes, together with the conversion result of the input signal of each channel of the input circuit, identification information of a corresponding channel.

4. A data processing unit comprising:
the AD converter according to claim 1; and
a CPU for performing predetermined operation processing by taking in the digital signal provided by the AD converter.

5. An AD converter comprising:
an input circuit for taking in an analog signal;
an operation circuit for converting the analog signal taken in through the input circuit; and
a bus for outputting a conversion result of the operation circuit,
wherein the input circuit includes a plurality of channels, each of which takes in the analog signal,
wherein the operation circuit includes a conversion result storing register, a parity bit generator circuit and a parity bit register, the conversion result storing register storing the conversion result of an input analog signal of each channel of the input circuit, the parity bit generator circuit being provided in correspondence to the conversion result storing register and generating a parity bit of the conversion result of the analog signal inputted through the input circuit, and the parity bit register storing the parity bit generated by the parity bit generator circuit, and
wherein the conversion result storing register writes, together with the conversion result of the input signal of each channel of the input circuit, identification information of a corresponding channel.

* * * * *